US010422897B2

(12) United States Patent
Schröder et al.

(10) Patent No.: US 10,422,897 B2
(45) Date of Patent: Sep. 24, 2019

(54) METHOD FOR DETECTING EARTHQUAKES AND LOCATING EPICENTRES BY MEANS OF A NETWORK OF LIGHTS

(71) Applicant: SCHREDER, Brussels (BE)

(72) Inventors: Helmut Schröder, Wiesbaden (DE); Daniel Brand, Köln (DE); Didier Wellens, Kraainem (BE)

(73) Assignee: SCHREDER, Brussels (BE)

( * ) Notice: Subject to any disclaimer, the term of this patent is extended or adjusted under 35 U.S.C. 154(b) by 154 days.

(21) Appl. No.: 15/525,250

(22) PCT Filed: Nov. 10, 2015

(86) PCT No.: PCT/EP2015/076136
§ 371 (c)(1),
(2) Date: May 8, 2017

(87) PCT Pub. No.: WO2016/075102
PCT Pub. Date: May 19, 2016

(65) Prior Publication Data
US 2017/0322330 A1    Nov. 9, 2017

(30) Foreign Application Priority Data

Nov. 10, 2014    (EP) .................................... 14192581

(51) Int. Cl.
*G06F 11/30*       (2006.01)
*G01V 1/00*        (2006.01)
(Continued)

(52) U.S. Cl.
CPC .............. *G01V 1/008* (2013.01); *G01P 15/02* (2013.01); *H03K 17/955* (2013.01); *H05B 37/0272* (2013.01)

(58) Field of Classification Search
CPC ..................................................... G01V 1/008
See application file for complete search history.

(56) References Cited

U.S. PATENT DOCUMENTS

2004/0135698 A1    7/2004  Webb et al.
2009/0086797 A1    4/2009  Wilcox
(Continued)

FOREIGN PATENT DOCUMENTS

EP    2034336 A1    3/2009
EP    2262350 A1    12/2010
(Continued)

*Primary Examiner* — Phuong Huynh
(74) *Attorney, Agent, or Firm* — Browdy and Neimark, P.L.L.C.

(57) ABSTRACT

Described herein is method for the detection of seismic activity using a network of lights, and in particular, street lights (43) arranged over a number of streets (42). Each light includes a control module having the facility for both long- and short-distance communication, the control modules being grouped with other control modules and associated with a group controller to create a short-distance or mesh network. Each control module includes a sensor which is capable of detecting seismic activity and data relating to such activity may be transmitted to a central server via its group controller using long-distance communication. Even if the sensors are relatively inaccurate, the high number of such sensors present in the network makes it possible to detect and analyze the activity using geocoordinate information provided by the control modules at the server. Information relating to an epicentre of an earthquake can be determined and distributed to control modules in the vicinity of the detected seismic activity (50) to provide warning light signals for the population in that vicinity.

19 Claims, 4 Drawing Sheets

Figure 1:
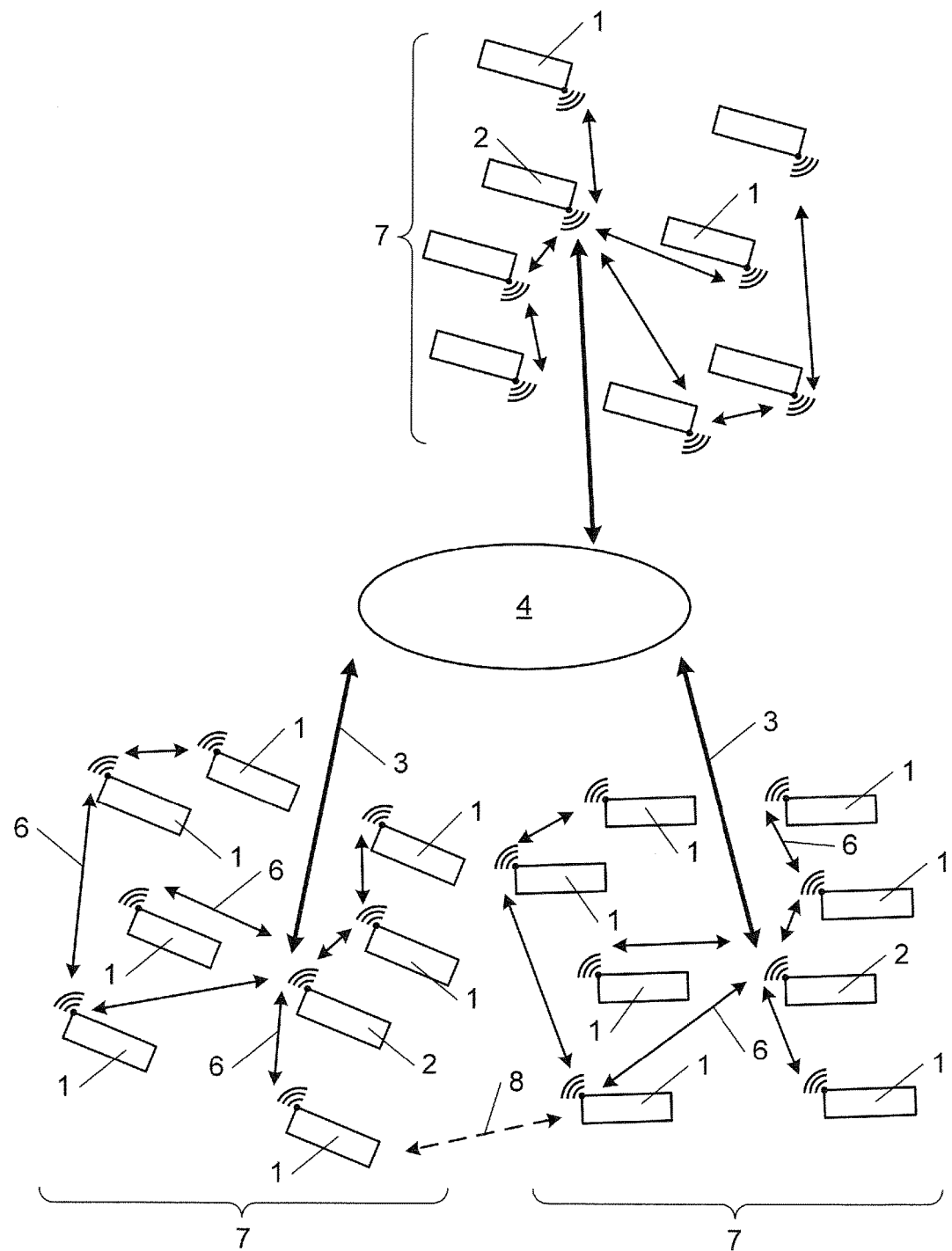

(51) Int. Cl.
*H05B 37/02* (2006.01)
*G01P 15/02* (2013.01)
*H03K 17/955* (2006.01)

(56) References Cited

U.S. PATENT DOCUMENTS

| | | | |
|---|---|---|---|
| 2010/0169021 A1* | 7/2010 | Moisio | G01V 1/008 702/15 |
| 2011/0215735 A1* | 9/2011 | Herbst | H04L 41/0803 315/297 |
| 2013/0016625 A1 | 1/2013 | Murias et al. | |
| 2014/0001963 A1 | 1/2014 | Chobot et al. | |

FOREIGN PATENT DOCUMENTS

| | | | |
|---|---|---|---|
| JP | H10253765 | A | 9/1998 |
| JP | 2004245725 | A | 9/2004 |
| JP | 2005244880 | A | 9/2005 |
| JP | 2006099529 | A | 4/2006 |
| JP | 2006284200 | A | 10/2006 |
| JP | 2007157491 | A | 6/2007 |
| JP | 2009244141 | A | 10/2009 |
| JP | 2011205444 | A | 10/2011 |
| JP | 2013522824 | A | 6/2013 |
| JP | 2013164695 | A | 8/2013 |
| JP | 2014052859 | A | 3/2014 |

* cited by examiner

METHOD FOR DETECTING EARTHQUAKES AND LOCATING EPICENTRES BY MEANS OF A NETWORK OF LIGHTS

This invention concerns a method for detecting earthquakes and locating epicentres by means of a network of lights, with these lights being particularly street lights.

The state of the art shows that earthquakes can be identified and their epicentres located by networks of seismographs. Furthermore, elaborate warning systems for warning of tsunamis have been installed to prevent injuries of persons as much as possible. Both systems exist side by side and are work-intensive to install.

The invention described herein aims to create a highly fail-safe system to solve this problem, which system is also cheaper to operate.

This task is solved by a method described in claim 1 as well as a network described in claim 16. Advantageous embodiments of the invention are described in the subclaims referring to the above-mentioned claims as well as in the following description.

The method according to this invention can be used to cheaply identify earthquakes and to locate their epicentres. Simultaneously, the fail-safe network can transmit messages to road users.

The method according to this invention, first of all makes use of multiple control modules, each of which is allocated or is to be allocated to one light and each of which is equipped with a long-distance communication module (e.g. GSM, GPRS, Iridium or another cellular network or an Ethernet connection), a short-distance communication module (ZigBee, 6 LoWPAN or similar), preferably a near field communication module or a geocoordinates module to determine of position of the control module based on GPS, GLONASS, Galileo, BeiDou or other in particular satellite based positioning systems, a controller, and additionally a control output (e.g. on a DALI or 0 resp. 1 to 10 volt basis). At least some of the control modules comprise at least one sensor for detecting acceleration and/or seismic waves. The control output can transmit control signals to a driver of an illuminant of the light, preferably a street light. Furthermore, the network is equipped with at least one server to be reached via the long-distance communication module. The long-distance communication module can be based on different techniques. For example it could be a cellular network, an IP-network or a long range peer to peer network. A suitable software for tele-management can run on this server, especially for communication with and for operation of the network of lights. For installation and for the operation of the network, the control modules are divided into one or more groups of control modules, with this division being based on information provided by the control modules concerning the environment, lights and/or control modules, and being performed by one of the servers.

As environmental information, in addition to geocoordinates, information regarding adjacent control modules in the short-distance network (e.g. connection quality and/or other RF characteristics and/or neighbourhood tables) and/or environment-specific information (e.g. light intensity in the surroundings) may be taken into consideration. The information concerning the lights may be information regarding the illuminants used, their exciters and/or further details of the allocated light, e.g. the current light intensity or dimming. The control module information is above all information used for clear identification of the control module, such as its IP address or another UID (Unique IDentifier).

According to this invention, the server selects one control module per group, or in case of a single group of the group, as group controller. This group controller selection is preferably performed by the server. The other control modules of the corresponding group use their short-distance communication modules to communicate with this controller. This means communication within a group uses the corresponding short-distance communication modules. Within the group, the control modules of the group form a short-distance network via their corresponding short-distance communication modules, preferably a mesh network. This leads to fast and fail-safe communication, particularly if the number of control modules per group is limited particularly to no more than 200, preferably no more than 50 control modules.

During normal operation of the network, preferably the group controller can only transmit its own environmental, light and/or control module information and the corresponding information received from its other control modules to the server via the long-distance communication module. According to the invention information of the sensors concerning the detection of acceleration and/or seismic waves of the control modules comprising a sensor as well as information of the geocoordinates modules of the corresponding control module are transmitted. This information can be used for the analysis of occasions of earthquakes or other shocks and can be transmitted to the group controller by way of the short distance communication network if necessary.

Based on the sensor and geocoordinate information transmitted to the server, the server can particularly analyse the information transmitted by the sensors of the control modules in order to identify seismic waves and/or earthquakes.

For this purpose, normal operation is understood as the usual operation of the network, in which each control module of the network is allocated to a group and in which all control modules carry out their actual task, controlling the light.

For both, the method described above and below, transmission of information is always executed through transmission of the corresponding data on the basis of specific communication protocols.

A network set-up like this leads to a more stable operation than previous network systems. Due to the redundant set-up of the respective control modules within a group, a new group controller can easily be determined by the server in case of a group controller failure caused by an earthquake. Once the new group controller has been announced within a group, i.e. on the level of the short-distance communication network (PAN=Personal Area Network), the other control modules not defined as group controllers establish their connections via the group controller. This means that the server can continue to control and monitor the system. At the same time, the single active control module (group controller) per group makes expenses significantly lower than in a network where all control modules communicate separately with the server via their respective long-distance module.

The set-up of the internal group network as mesh network also improves stability of the system and communication on the PAN level.

If "with" is used above or below to explain process steps, this does not necessarily mean that the connected process steps are simultaneous. Rather, these process steps may (but do not have to) be simultaneous.

The data registered by the acceleration sensors, which are preferably integrated directly into the control module, can be transmitted to the server via the group controller and its long-distance communication module together with a time information that makes possible to determine the time at which any given measurement data has been made by the sensor. The time information is preferably determined by the geocoordinates module. In one embodiment, time information is synchronised at a predetermined time each day using a real-time clock and events occurring and/or measurements made after that synchronisation are effectively relative to that synchronisation.

Even if the sensors are relatively inaccurate, the high number of control modules of lights installed in a network, makes it possible to detect earthquake waves and analyse them on the server according to their location and time due to the geocoordinates transmitted by the control modules and the group controller. This means that even in case of weak and/or inaccurate signals, the resolution of the P and/or S waves is sufficient, making a comparatively detailed image of the course of the earthquake possible. Information regarding the earthquake epicentre can be extracted from this information and the local distribution of the control modules accordingly. This can either be carried out on the network server or on a special server allocated to an earthquake centre.

Accordingly, a signal controlling the lights triggered by a signal from the server to the group controllers or control modules can be used as a subsequent tsunami warning or earthquake warning, for instance by sending out light signals which the population has been informed of beforehand. These may be light patterns of temporarily and/or spatially propagating intensity, for instance wave-like light signals running along a street.

For fail-safe operation it is also beneficial, if a command for time-limited new registration of adjacent module information can be emitted or transmitted by the server subject to the frequency of disruptive events and/or a specified number of replaced and/or newly installed control modules. To do so, the control modules may switch to another PAN-internal communication mode and contact adjacent control modules via the respective short-distance communication module and register these as well as the quality of their connection to them. Once a specific time has elapsed and/or after identification of a specified number of closely adjacent modules, this information can be transmitted to the group controller via the respective short-distance communication module or, if the connection is active, to the server via the long-distance communication module, possibly together with other geo- and/or light- and/or control module-specific information. The server can use this information to check the group division and/or group controller allocation, carry out this division/allocation and/or revise it, if necessary. This compensates for failure of control modules and/or lights caused by an earthquake.

According to a further development of the method according to this invention, information relevant for multiple groups can be exchanged between adjacent groups. To ensure that particularly sensor information relevant for multiple groups or data relevant for multiple groups based on sensor information can be transmitted fast, for instance in order to trigger a light signal, it is beneficial if the respective information can be transmitted directly via the long-distance network to a control module of an adjacent group, by-passing the server. In particular, this information can be transmitted directly from the control module equipped with the sensor which created the information. Accordingly, the communication can be carried out via the long-distance network provider, but does not have to use the server. For protocol purposes the server can be informed of the respective information. In particular, transmission of this information uses the known group controllers in the long-distance network.

As an alternative, data relevant for multiple groups based on sensor information can be transmitted directly via the short-distance network to a control module of an adjacent group, by-passing the server, with transmission of the date preferably using a different frequency band than the one used during normal operation within one group. For this purpose, multiplex operation of the short-distance module can, once again, be an advantage.

To ensure that operation remains flexible even in emergencies, it is beneficial, if in the corresponding software on the server a group-independent selection of control modules for the exchange of data relevant for multiple groups can be made. This can be supported graphically, for instance if those control modules which are to exchange sensor information are marked on an overview map. This means that, for instance groups of control modules which can no longer be reached via long-distance communication can be reached by adjacent groups.

To set up a comparatively fail-safe mesh network, it can be advantageous for the respective group controller to receive data about the members of its group from the server and for the group controller to determine itself as group controller in relation to the other group members. As an alternative or in addition, the other group members may receive data about the communication path or the desired group controller to ensure that communication with the server remains problem-free.

Accordingly, the information provided by the server can be information for the control modules, which informs these about adjacent control modules of the same group. The server may, for instance, extract this data by observing the geocoordinates of the respective control modules.

To facilitate the fastest possible start-up of the network without delays after a malfunction or failure, the control modules can scan the short-distance network for other control modules automatically after they are first started up, thereby creating an internal table of adjacent modules which contains the closest adjacent modules in the short-distance network. This list can later be transmitted to the server. In particular, this adjacent module information can be transmitted to the server together with other light-specific or control module-specific information after the mesh network is set up and a group controller has been allocated.

Instead of observing information about their short-distance network environment on the basis of malfunctions or a request based on the number of new control modules of a group, the modules can preferably register this information at a pre-determined time and/or due to an initialisation by the server. For this purpose it may be helpful to limit communication within the mesh network via the group controller to the server for a short time and only allow observation and communication with the closest adjacent modules in the mesh network based on the short-distance module and the respective protocol. This serves to create adjacent module tables or lists, with information about the signal strength and/or quality of the connection to the respective adjacent modules being registered at the same time. This information can be cached and/or stored and then transmitted via the group controller or, if all long-distance communication modules of the control modules are active, transmitted directly to the server.

For targeted inspection or checking the status of several control modules, these should preferably be pre-selected by the server before a predefined inquiry, a process in which for instance the control module concentration can be determined and checked on the basis of a pre-defined or definable limit value. Subsequently, if the limit value is exceeded, a redetermination of the environment, light and/or control module specific information can be initialised.

To enable the server to select a suitable group controller, it may be beneficial to have the respective control modules register and save data concerning their UID in the short-distance network, their IP address in the long-distance network, their UID in the near field network, light-specific information, data of a number of neighbours in the short distance network, particularly of up to 50, preferably up to 10 adjacent control modules in the short-distance network including their UIDs and/or the connection quality of the adjacent control modules during a scan process and then have this information (data) transmitted via the group controller to the server at a given time. If the control module is active, i.e. equipped with an active long-distance network access, the server may receive this information directly from the control module.

The commissioning of the network and the division into groups and/or allocation of the group controller on the server should preferably be carried out automatically. As an alternative or in addition, the division into groups and/or allocation of the group controller may be varied by user input. For instance, this is beneficial if a program running on the server causes an ambiguous selection of a group controller.

To keep the latency in the network under a desired level, a maximum definable number of control modules being set on the server should preferably be allocated to each group by the server, with 200 control modules potentially being the upper limit. Tests and simulations with up to 2000 lights have shown that the latency in larger network groups becomes too large to guarantee proper operation and regular inspection of the network status.

Preferably the number of control modules should be less than 150 per group, particularly less than 50 control modules.

To make detection of environment information by the short-distance network and communication in the short-distance network for purposes of the normal operation (communication with the server) more problem-free, it may be beneficial for the corresponding communication in the short-distance network to take place on different frequency bands of said network. Preferably the same antennae can be used for this (multiplex operation).

A light according to this invention, especially a street light, is equipped with a control module described at the beginning, which is equipped with at least one sensor for detecting acceleration and/or seismic waves. In addition, as described above, the control module is equipped with a long-distance communication module, a short-distance communication module and a geocoordinates module (GPS, Glonass, BeiDou, etc.). In addition, a control output (0 resp. 1-10 V, Dali) to control an exciter of the light as well as several means of power supply are installed.

In particular, the sensor is a symmetrical differential-capacitive sensor particularly suitable for registering seismic waves.

A network according to this invention designed for carrying out the method described above and below is a solution to the task described at the beginning, just as a network equipped with a majority of lights as described above and below and/or suitable for carrying out the method according to this invention.

Figure 2:
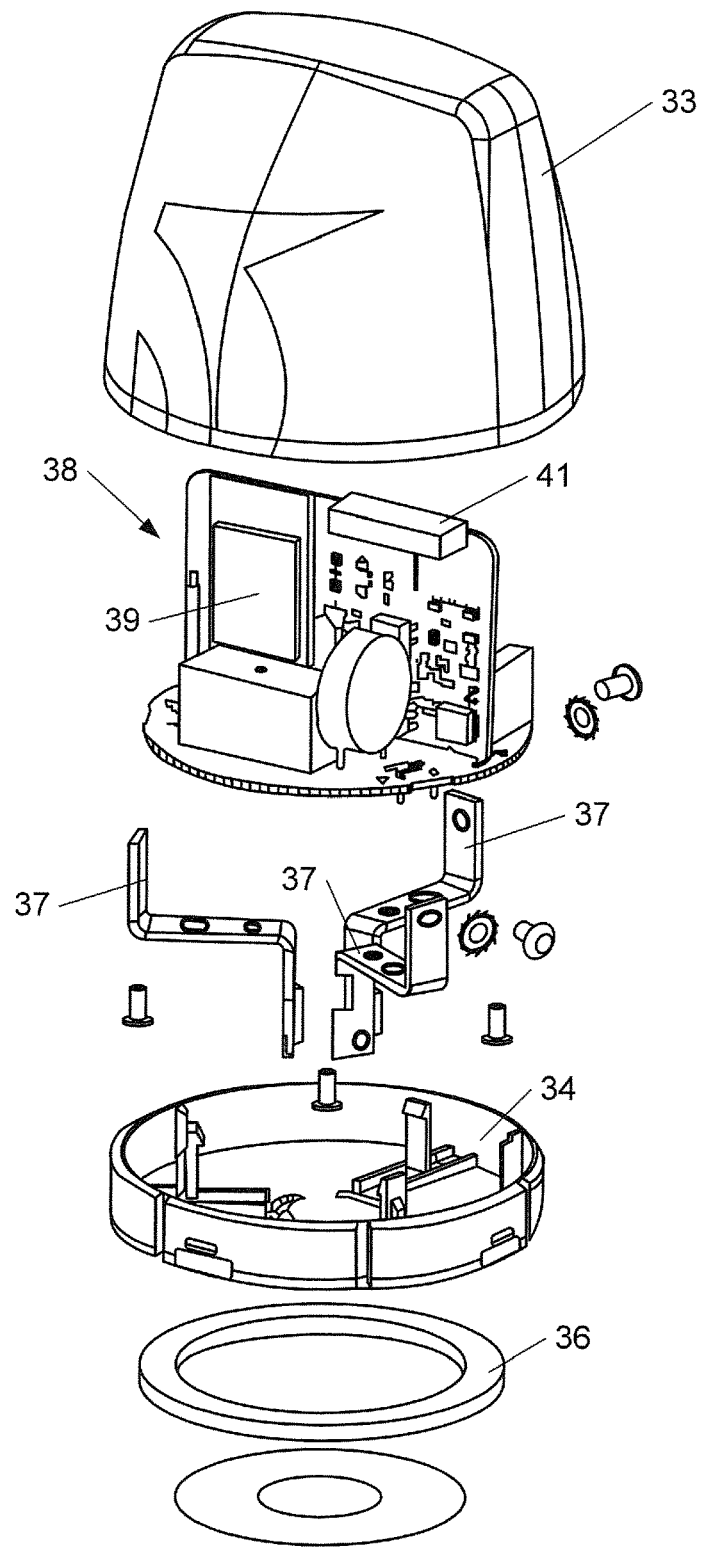
Figure 3:
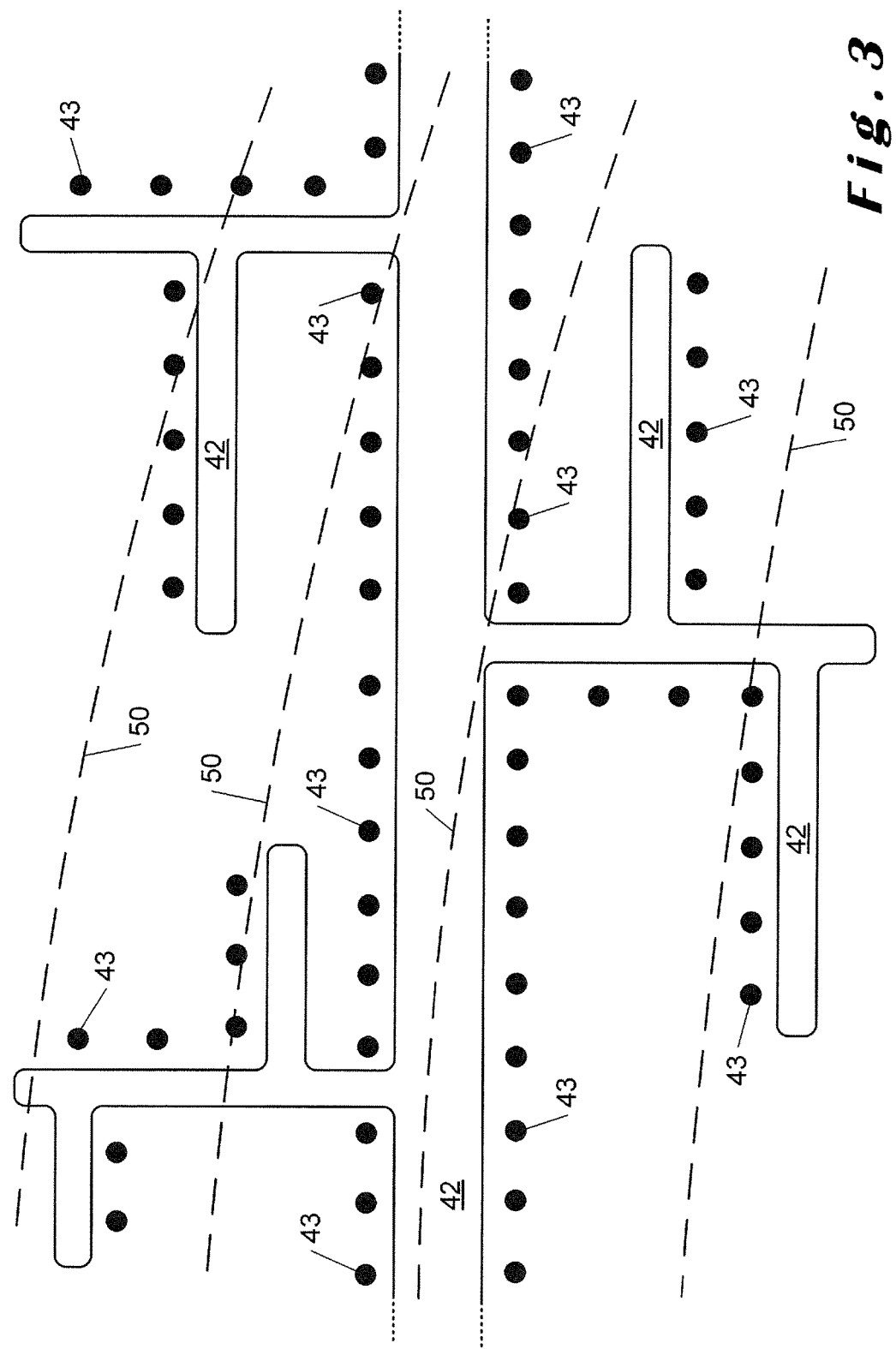
Figure 4:
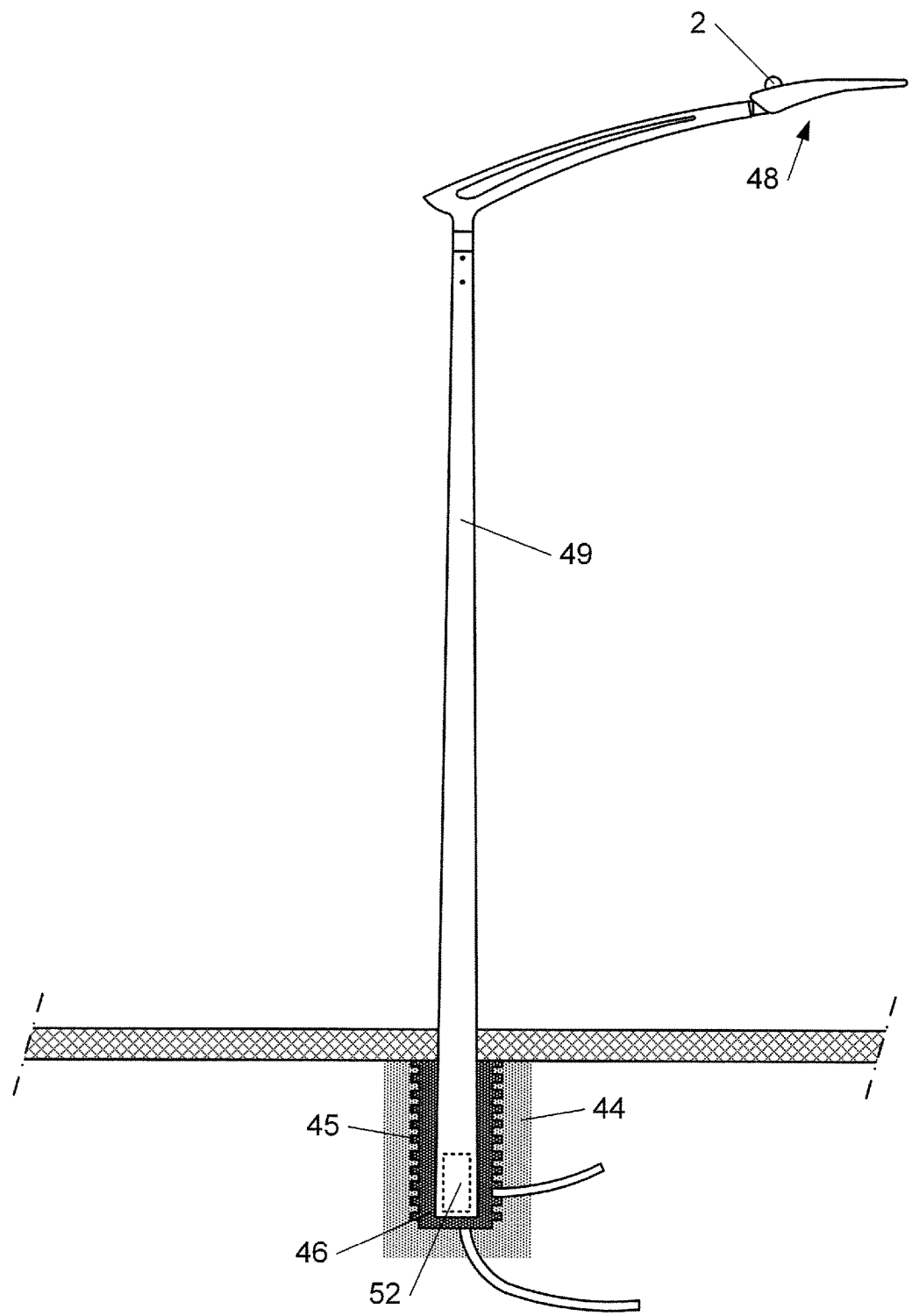

For further advantages and detailed features of the invention, refer to the following figure descriptions. The schematic figures show:

FIG. 1: a network according to this invention,
FIG. 2: a component of the object according to FIG. 2
FIG. 3: a network working according to the process of this invention, and
FIG. 4: a component of the object according to FIG. 3

Individual technical features of the design examples described below can also be combined with design examples described above as well as the features of independent claims and potential further claims to form objects according to this invention. If this makes sense, functionally equivalent elements are given the same reference number.

The present invention comprises a network comprising a plurality of luminaires, each luminaire having a controller or control module for controlling the operation thereof, and a server. Each controller is connected over an GSM Modem or a low power radio network (LPRN) and decides how best they can communicate to the server. In a preferred embodiment, the controllers are able to form small networks with a group controller, the group controller having an active GSM modem which is shared within the small network and through which communication is made with the server over a provider GSM network.

As each controller communicates with the group controller, there is no need for more than one active GSM modem to be present in each small network with the advantage that costs can be reduced (GSM network costs). Each controller uses the LPRN to communication to its group controller using 6LoWAN using an IPv6 protocol. As a result, each small network comprises an internet protocol version 6 (IPv6) network and communication within the network is only using IPv6 protocols.

The server also operates using IPv6 protocols. However, to transmit information from each group controller to the server, a GSM network is needed and currently, these operate using internet protocol version 4 (IPv4) protocols. This means that communication between the group controller and the server needs to be converted from IPv6 to IPv4 for transmission over the GSM network and then converted back again at the server. In addition, the communication over the GSM network is encrypted and secure, the encryption being provided in accordance with a suitable encryption protocol.

The server can decipher the encrypted communications received from group controllers over the GSM network and can also encrypt communications for transmission to the group controllers over the GSM network. This provides an end-to-end encrypted communication between the group controllers and the server.

According to the method of this invention, FIG. 1 shows a multitude of control modules 1 being allocated to a group controller 2. The hardware of group controller 2 is identical to control modules 1. However, only the respective group controller 2 can use long-distance connection 3 to communicate with a server 4. Typically this is access to a local cellular network provider, through which the server can then remain accessible based on IP-WAN. Communication between the servers and group controllers can, for instance, be carried out via a common internet protocol (TCP/IP).

Within a group 7, the control modules communicate with each other via short-distance connections 6. Preferably this communication should be based on, a mesh network on IEEE 802.15.4 standard, for example ZigBee.

The individual groups 7 of control modules 1, 2 can generally not see each other and therefore cannot interfere with each other. However, for communication of several groups it may be intended for control modules with adjacent locations to use short-distance connection 8 to share/exchange or forward sensor data between groups. This can then be used to initiate actions such as an increase of the light volume. As an alternative, this communication may also use the corresponding group controllers 2, which can see each other through their IP addresses on the internet. The information regarding which control module may communicate with which other control module and how this module can communicate is defined on the server and carried out, for instance in case of short-distance communication between groups, in particular by means of a multiplex unit of each control module.

A control module for a light according to this invention, which can be used to implement the method described above, is preferably designed as a separate unit, which can be installed on a light head, for instance of a street light (cf. FIG. 4). For further details regarding the crucial components of the externally installed control module, see FIG. 2. The exploded view of this figure comprises the control module, a top housing part 33 and a bottom housing part 34. The bottom housing part is to be fastened to a base fitted on top of the light by means of seal 36. The part is connected with the base through bayonet-type twisting contacts 37. These contacts 37 are fastened in housing 34 and also the location of the central circuit board unit 38. Among other things, a controller 39, short- and long-distance communication modules and an acceleration sensor unit 41 for detecting in particular seismic waves are located on this circuit board unit.

This figure does not show an RFID reader, which can be installed in a base on the light housing side in order to register light-specific data of an RFID transponder in the near field.

FIG. 3 shows a street network with multiple streets 42 with a length of several hundred meters. A multitude of street lights 43 with their respective control modules are placed alongside these streets. Each of the control modules is equipped with sensors for detecting seismic waves. These may be simple acceleration sensors. As an alternative, more sophisticated seismometers may be integrate in the street light.

Due to the integration of a street light into the ground according to FIG. 4 and the fixed installation and connection of the light with the ground, for instance by means of a layer of lean concrete 44, a foundation pipe 45 or dense filling material 46, acceleration sensors located in or on the light head 48 in the control module can easily register the seismic waves propagating in the ground or along the surface via mast 49. As an alternative or in addition, a seismometer 52 with a higher resolution can be located in the foot of mast 49 and connected with control module 2 via a data line (not shown). A significant advantage of this system is that a large number of sensors distributed on a large surface can be evaluated almost simultaneously, making analysis for detection of the seismic waves 50, depicted as a broken line in FIG. 3, possible. At the same time, an information system is provided, the light signals of which can inform a multitude of road users at the same time.

The invention claimed is:

1. A method for detecting earthquakes and locating epicentres, the method including the steps of:
providing a network of lights, each light having a control module associated therewith, each control module comprising:
a long-distance communication module,
a short-distance communication module,
a geocoordinates module,
a controller, each control module being operable for providing a control output for controlling a driver of the light,
providing at least one sensor for detecting at least one of acceleration and seismic activity, in at least some of the control modules,
providing at least one server reachable via the long-distance communication module,
dividing the control modules into one or multiple control module groups based on at least one of: environmental, light and control module information provided by the control modules,
selecting one of the control modules of each group as a group controller,
forming a short-distance network with the group controller and the other control modules within the group, via respective short-distance communication modules,
transmitting sensor information and geocoordinate information from the control modules to the associated group controller via the short-distance communication modules of the control modules,
transmitting, during normal network operation, sensor information and geocoordinate information from the group controller of the groups to the at least one server via the long-distance communication module,
analysing the sensor information and the geocoordinate information transmitted to the at least one server by the group controllers of the groups to extract earthquake epicentre information therefrom using the local distribution of the control modules, and
determining on the server, in case of a failure of the group controller of a group, a new group controller and establishing the connections using the short-distance communication modules with the other control modules not defined as group controllers via the new group controller.

2. The method according to claim 1, wherein a time information is included in at least one of the sensor information and the geocoordinates information.

3. The method according to claim 1, further comprising the step of analysing, on the server, the sensor information provided by the control module sensors and geocoordinates information to identify the presence of seismic waves.

4. The method according to claim 1, wherein the short-distance network comprises a mesh network.

5. The method according to claim 1, wherein the short-distance communication module uses at least one of: ZigBee and 6 LoWPAN.

6. The method according to claim 1, wherein the long-distance communication module uses at least one of: GSM, GPRS, Iridium, a cellular network and an Ethernet connection.

7. The method according to claim 1, wherein the geocoordinates module uses at least one of: GPS, GLONASS, Galileo, BeiDou and a satellite based positioning system.

8. The method according to claim 1, further comprising the step of transmitting a server signal for controlling the lights from the server to at least one of: the group controllers and the control modules.

9. The method according to claim 8, further comprising the step of creating a light pattern with at least one of: temporarily propagating intensity and spatially propagating intensity on the basis of the server signal.

10. The method according to claim 1, further comprising the steps of:

emitting from the server a request for temporarily limited registering of adjacent module information, registering, using the control modules of a group, adjacent control modules and the quality of their connection with these via their short-distance communication module, transmitting this information to at least one of: the group controller via their short-distance communication module and the server via their long-distance communication module, checking, on the server, the group division and the group controller allocation, and updating, on the server, at least one of: the group division and the group controller allocation in accordance with the adjacent module information.

11. The method according to claim 1, further comprising the step of:

selecting, on the server, control modules irrespective of the group, for exchanging data relevant to multiple groups.

12. The method according to claim 1, further comprising the step of transmitting sensor information relevant for multiple groups to a control module of an adjacent group via the long-distance module, by-passing the server.

13. The method according to claim 1, further comprising the step of transmitting the sensor-based data relevant for multiple groups directly to the control module of an adjacent group, via the short-distance network and by-passing the server.

14. The method according to claim 13, wherein the step of transmitting sensor-based data relevant for multiple groups takes place on a different frequency band than normal operation within a group.

15. The method according to claim 2, further comprising the step of analysing, on the server, the sensor information provided by the control module sensors and geocoordinates information to identify the presence of seismic waves.

16. The method according to claim 1, wherein the lights are street lights.

17. A network of lights comprising a plurality of control modules, each of which being allocated to one light and comprising:

a short-distance communication module suitable for communication with other control modules, a long-distance communication module suitable for communication with a server, a geocoordinates module, and a control output for controlling a driver of the light, wherein at least some of the control modules comprising at least one sensor for detecting at least one of: acceleration and seismic waves, wherein the network of lights comprises at least one server reachable via the long-distance communication module;

wherein the control modules are divided into one or multiple control module groups based on at least one of environmental, light and control module information provided by the control modules;

wherein one of the control modules of each group is selected as a group controller;

wherein the sensor information provided by the control module sensors and geocoordinates information may be analyzed to identify the presence of seismic waves;

wherein the server is suitable for determining in case of a failure of the group controller of a group, a new group controller; and wherein the new group controller is suitable for establishing the connections using the short-distance communication modules with the other control modules not defined as group controllers.

18. The network of lights according to claim 17, wherein the sensor is a symmetric, differential-capacitive sensor.

19. The method according to claim 12, wherein the step of transmitting sensor-based data relevant for multiple groups takes place on a different frequency band than normal operation within a group.

* * * * *